United States Patent
Vogler et al.

(10) Patent No.: US 9,887,613 B2
(45) Date of Patent: Feb. 6, 2018

(54) LITHOGRAPHY DEVICE WITH EDDY-CURRENT BRAKE

(71) Applicant: Carl Zeiss SMT GmbH, Oberkochen (DE)

(72) Inventors: Alexander Vogler, Aalen (DE); Markus Hauf, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 475 days.

(21) Appl. No.: 14/456,541

(22) Filed: Aug. 11, 2014

(65) Prior Publication Data
US 2014/0346909 A1    Nov. 27, 2014

Related U.S. Application Data (63) Continuation of application No. PCT/EP2013/000480, filed on Feb. 19, 2013.

(30) Foreign Application Priority Data

Feb. 20, 2012   (DE) .................. 10 2012 202 553

(51) Int. Cl.
*H02K 49/04*       (2006.01)
*G03B 27/20*       (2006.01)
(Continued)

(52) U.S. Cl.
CPC .............. *H02K 49/04* (2013.01); *G03F 7/709* (2013.01); *G03F 7/70258* (2013.01);
(Continued)

(58) Field of Classification Search
CPC ...... H02K 21/025; H02K 49/10; H02K 21/22; G03B 27/32; G03B 27/42; B60L 7/00; B60L 7/28
See application file for complete search history.

(56) References Cited

U.S. PATENT DOCUMENTS

| | | | | | |
|---|---|---|---|---|---|
| 5,440,183 | A | * | 8/1995 | Denne | .................... F15B 15/00 310/12.26 |
| 5,477,093 | A | * | 12/1995 | Lamb | .................. H02K 49/046 310/75 D |

(Continued)

FOREIGN PATENT DOCUMENTS

| CN | 101082783 A | 12/2007 |
|---|---|---|
| CN | 101855468 A | 10/2010 |

(Continued)

OTHER PUBLICATIONS

Japanese Office Action, with English translation thereof for JP Appl. No. 2014-556960, dated Aug. 23, 2016, 10 pages.

(Continued)

*Primary Examiner* — Tran Nguyen
(74) *Attorney, Agent, or Firm* — Fish & Richardson P.C.

(57) ABSTRACT

A lithography device includes an eddy-current brake for damping the movement of a structural element of the lithography device. The eddy-current brake includes a plurality of magnets disposed in an arc-shaped arrangement, and a plurality of electrically conductive sheets arranged respectively between adjacent ones of the magnets. A relative movement between the magnets and the electrically conductive sheets in a direction to be damped inducing eddy currents in the electrically conductive sheets.

27 Claims, 6 Drawing Sheets

(51) Int. Cl.
*G03F 7/20* (2006.01)
*H02K 49/10* (2006.01)

(52) U.S. Cl.
CPC ...... *G03F 7/70766* (2013.01); *G03F 7/70825* (2013.01); *H02K 49/10* (2013.01)

(56) References Cited

U.S. PATENT DOCUMENTS

| | | | |
|---|---|---|---|
| 6,700,715 | B2 | 3/2004 | Sorg et al. |
| 6,788,386 | B2 | 9/2004 | Cox et al. |
| 7,145,270 | B2 | 12/2006 | Mizuno |
| 7,502,103 | B2 | 3/2009 | Plug et al. |
| 7,586,598 | B2 | 9/2009 | Plug et al. |
| 7,961,309 | B2 | 6/2011 | Plug et al. |
| 8,120,832 | B2 * | 2/2012 | Ernst ...................... G11B 7/128 359/230 |
| 8,625,070 | B2 | 1/2014 | Farnsworth et al. |
| 2002/0075574 | A1 | 6/2002 | Sorg et al. |
| 2002/0109437 | A1 | 8/2002 | Sorg et al. |
| 2005/0140961 | A1 | 6/2005 | Yanagisawa et al. |
| 2007/0153348 | A1 | 7/2007 | Roux et al. |
| 2007/0279644 | A1 | 12/2007 | Plug et al. |
| 2007/0279742 | A1 | 12/2007 | Plug et al. |
| 2008/0106361 | A1 * | 5/2008 | Makarovic ............ F16F 15/035 335/100 |
| 2009/0180091 | A1 * | 7/2009 | Farnsworth ............... F16F 9/06 355/67 |
| 2009/0296081 | A1 | 12/2009 | Plug et al. |
| 2011/0127128 | A1 | 6/2011 | Fasick et al. |
| 2011/0148236 | A1 * | 6/2011 | Gates .................... F16F 15/035 310/105 |
| 2011/0317140 | A1 | 12/2011 | Sigel et al. |

FOREIGN PATENT DOCUMENTS

| | | |
|---|---|---|
| DE | 100 62 786 | 6/2002 |
| DE | 10 2008 041 310 | 3/2009 |
| EP | 1 862 856 | 12/2007 |
| EP | 2 339 205 | 6/2011 |
| EP | 2327905 | 6/2011 |
| JP | H04-337141 | 11/1992 |
| JP | H10-89406 | 4/1998 |
| JP | H10-196714 | 7/1998 |
| JP | 2007-227891 | 9/2007 |
| JP | 2008-138871 | 6/2008 |
| JP | 2011-117602 | 6/2011 |
| JP | 2011-133109 | 7/2011 |
| WO | WO 2009/062606 | 5/2009 |
| WO | WO 2010/094684 | 8/2010 |

OTHER PUBLICATIONS

Chinese Office Action, with translation thereof, for CN Appl No. 201380013579.9, dated Nov. 2, 2015.
Chinese Office Action, with translation thereof, for CN Appl No. 2013800135799, dated Jun. 17, 2016.
International Search Report for corresponding PCT Appl No. PCT/EP2013/000480, dated Nov. 4, 2013.
Written Opinion for corresponding PCT Appl No. PCT/EP2013/000480, dated Nov. 4, 2013.
Japanese Office Action, with English translation thereof for corresponding Appl. No. 2014-556960, dated May 10, 2017. (11 pages).

* cited by examiner

LITHOGRAPHY DEVICE WITH EDDY-CURRENT BRAKE

CROSS-REFERENCE TO RELATED APPLICATIONS

The present application is a continuation of, and claims benefit under 35 USC 120 to, international application PCT/EP2013/000480, filed Feb. 19, 2013, which claims benefit under 35 USC 119 of German Patent Application No. 10 2012 202 553.7, filed on Feb. 20, 2012. The entire contents of German Patent Application No. 10 2012 202 553.7 and international application PCT/EP2013/000480 are incorporated herein by reference.

FIELD OF THE INVENTION

The invention relates to a lithography device with an eddy-current brake for damping a structural element of the lithography device.

RELATED ART

Such lithography devices are used for example in the manufacture of integrated circuits or ICs in order to image a mask pattern in a mask onto a substrate such as, for example, a silicon wafer. In the process, a light beam generated by an illumination device is, for example, directed onto the substrate through the mask. An exposure lens is provided for focusing the light beam onto the substrate, wherein the lens can consist of a plurality of optical elements such as, for example, mirrors and/or lens elements. In respect of the alignment thereof, the individual optical elements should be positioned as precisely as possible because even small deviations in the position of the optical elements can have an adverse effect on the imaged pattern, which may lead to defects in the manufactured integrated circuits. For this reason it is important to damp vibrations and the like in the optical elements.

WO2010/094684 A1 discloses a projection exposure apparatus with an optical element, which is attached to an outer frame via an actuator system (cf., for example, FIG. 3 and the associated description). The actuator system can have a piezo-crawler, piezo-actuators, cylinder coils or eddy-current brakes.

US 2007/0153348A1 discloses an eddy current damper including a rod, a series of conducting plates coupled to the rod, and layers of magnets. The alternating layers have alternating magnetic fields. When an optical element moves, the optical element will exert a force on the rod. The rod causes the conducting plates to move relative to the alternating layers of magnets to generate eddy currents within each of the conducting plates, such that the eddy currents damp the motion of an optical element.

US 2002/0109437A1 discusses the damping of oscillations in channels for a coolant for an optical element. To this end, it is proposed that the oscillations are captured by sensors, the result of this capture being fed back to actuators, which are embodied as piezoelectric elements. The actuators produce oscillations which are in anti-phase to turbulence in the liquid and the amplitude of which has at least the same magnitude.

U.S. Pat. No. 6,788,386 B2 discloses a lithography device, in which a reaction mass and an actuator are used to reduce unwanted vibrations of an optical element in the projection system of the lithography device.

With increasing requirements in relation to the resolution of lithography devices, there is a sustained demand for improved damping devices for damping the movement and unwanted resonances of optical elements in lithography devices. In particular, conventional damping devices on the basis of eddy-current brakes are often only designed for damping in respect of one or two degrees of freedom. In order to damp the optical element with respect to all six degrees of freedom, provision must thus be made for a plurality of damping devices, which is complicated and increases spatial requirements. Damping devices on the basis of rubber dampeners can bring about damping in more degrees of freedom; however, the use thereof in the field of lithography devices is problematic due to the rubber abrasion thereof and due to contamination.

SUMMARY OF THE INVENTION

It is therefore an object of the present invention to develop a lithography device with a damping device, which can contactlessly damp the movement of a flexibly mounted structural element with a compact arrangement. It is a further object of the invention to develop a lithography device in which the movement of the structural element is damped with respect to a number of degrees of freedom.

In one aspect of the invention, this object may be achieved by a lithography device comprising an eddy-current brake for damping the movement of a structural element of the lithography device, the eddy-current brake comprising a plurality of magnets disposed in an arc-shaped arrangement, and a plurality of electrically conductive sheets arranged respectively between adjacent ones of the magnets, a relative movement between the magnets and the electrically conductive sheets in a direction to be damped inducing eddy currents in the electrically conductive sheets.

As a result of arranging the magnets in an arc-shaped arrangement, it is possible to provide an eddy-current brake, which can contactlessly damp the movement of a flexibly mounted structural element with a compact arrangement. It should be noted that in this context, "arc" means a segment of a differentiable curve, in particular one that is arranged within a two-dimensional plane. The arc shape in which the magnets are arranged may be a circular arc shape, which allows a particularly compact arrangement. However, there is no limitation to circular arc shapes and other arc shapes, such as elliptical, hyperbolic, parabolic arc shapes and the like are possible as well. Moreover, an arc-shaped arrangement makes it possible to damp the movement of the structural element in a plurality of degrees of freedom, for example in all six degrees of freedom. In this context, it is noted that, depending on the layout of the magnets, the damping ratio is not the same for all directions (degrees of freedom), and the direction for which the damping ratio is the largest is also referred to as the primary direction to be damped.

The magnets can be arranged in stacks of magnets, which respectively include a plurality of magnets. Here, adjacent magnets in the stacks of magnets may be arranged in such a way that the opposing poles thereof are arranged next to one another. In particular, the magnets may be stacked in the primary direction to be damped, with their opposing poles arranged next to one another. This results in an arrangement of the magnets in a number of planes, wherein the direction of the fields generated by the magnets in the individual planes alternates along the primary direction to be damped. Hence, as a result of such an alternating arrangement of the magnets, the magnetic field along the primary direction to be damped frequently changes the direction thereof and therefore increases the damping effect. Large eddy currents are induced in the process, and so a high degree of damping can be obtained.

At least two, preferably three, particularly preferably four or more stacks of magnets may be provided. Such a parallel arrangement of stacks of magnets with electrically conductive sheets (fins) arranged therebetween corresponds to a parallel arrangement of a plurality of eddy-current brakes, and so an even greater degree of damping can be achieved using a compact arrangement.

The stacks of magnets can respectively include an even number of magnets. As a result of this, it is possible to reduce or eliminate the parasitic magnetic field.

A notable eddy-current effect already occurs when the angle of the circular arc is at least 30°, preferably at least 45°, particularly preferably at least 60°. The device is particularly effective and compact if the angle of the circular arc is 360°, i.e. if the magnets are arranged along a complete circle.

A particularly compact and efficient arrangement along the circular arc is possible if the magnets are trapezoidal.

In one embodiment, the lithography device furthermore has a holder device for holding the magnets, comprising a base section and a receptacle section, wherein the receptacle section is rigidly connected to the structural element and the base section and the receptacle section are interconnected by spring elements. The spring elements may be webs, for example, that extend radially between the receptacle section and the base section. With such an arrangement, a particularly compact can be realized.

A magnetic field generated by the magnets may extend in a plane that includes an arc defined by the arc-shaped arrangement, and the primary direction to be damped extends at an angle that is not greater than 45° with respect to a normal to that plane. In other words, the primary direction to be damped does not have to be parallel to the normal on the plane in which the magnets are arranged, but a better damping ratio can be achieved if the direction to be damped extends substantially parallel to a normal to the plane including the arc defined by the arc-shaped arrangement, i.e. the plane in which the layers of magnets are arranged.

In another aspect of the invention, the eddy-current brake comprises a plurality of sets of magnets, the magnets of each set being disposed in an arc-shaped arrangement within a predetermined plane, wherein the planes of adjacent sets are tilted with respect to each other, such that the sets are disposed along a trajectory of the structural element whose movement is to be damped. With such an arrangement, it is possible to damp structural elements that do not perform a simple translational or rotational movement, but that move along a non-linear trajectory. The trajectory of the structural element may be arc-shaped, for example. This allows smooth damping of the movement of the structural element.

The electrically conductive sheets may be attached to the structural element. Alternatively, it is also possible that the electrically conductive sheets are coupled to a moving part of an actuator for positioning the structural element, for example.

The magnets can be attached to the structural element and rigidly connected thereto. However, it is just as easily possible for the structural element to be arranged in a moveable fashion relative to the magnets. An advantage arising in the first case is that, for example, it is possible to mount the structural element using more rigid spring elements because the weight of the magnets contributes to the weight of the structural element. In the latter case, the magnets can be provided on the side of a structure frame of the lithography device.

In another embodiment, the magnets are provided in a cylindrical magnet arrangement, which is attached to a cylinder coil of an actuator for positioning the structural element.

The damping device can be integrated in an actuator for positioning the structural element. Hence a particularly compact arrangement can be provided. Here, the actuator can, for example, be embodied as a voice-coil actuator or as a gravity compensator. The structural element can, in particular, be an optical element of the lithography device. The structural element may be elastic.

Further exemplary embodiments will be explained with reference to the attached drawings.

Unless stated otherwise, the same reference signs in the figures denote equivalent or functionally equivalent elements.

EMBODIMENTS OF THE INVENTION

First Embodiment

Figure 1:
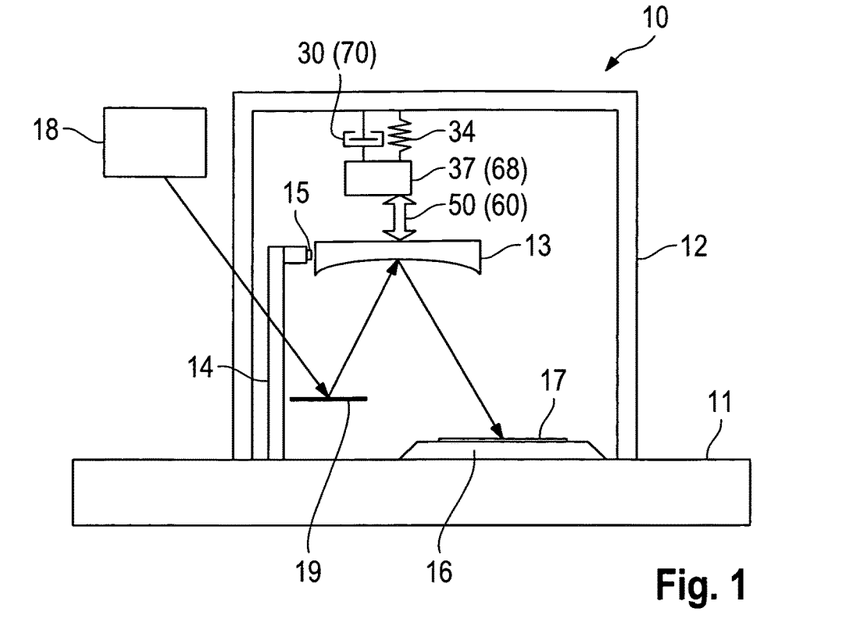
FIG. 1 shows a schematic view of a lithography device.

FIG. 1 shows a schematic view of a lithography device 10 as per a first embodiment. This lithography device 10 comprises a base plate 11, on which a holder frame 12 for holding at least one optical element 13, and also a measurement frame 14 for holding a sensor arrangement 15 are provided. The lithography device 10 typically has a plurality of optical elements. However, merely one optical element 13 is illustrated in an exemplary fashion in FIG. 1 in order to explain the functionality of the lithography device 10 schematically.

A wafer receptacle 16 is provided below the optical element 13 in the illustrated example; a wafer 17, e.g. a silicon wafer, can be held in the wafer receptacle. By way of example, the wafer receptacle 16 can be embodied as a step-and-scan system, which moves the wafer 17 step-by-step relative to the base plate 11, both during the exposure and during the exposure breaks.

An illumination device 18 is provided above the optical element 13; it generates a beam for exposing the wafer 17. The light beam emanating from the illumination device 18 passes a mask 19, which is merely illustrated schematically here, and, in the illustrated example, is bundled by the optical element 13, which is embodied as a mirror system, in such a way that a pattern which is provided in the mask 19 is imaged with a reduced size on the wafer 17. As an alternative to this embodiment, provision can also be made for a lens-element arrangement, i.e. a combination of a plurality of lens elements, as optical elements 13.

In order to ensure a high optical resolution, the optical element 13 must be arranged precisely at the optimum position and with an optimum orientation during each exposure process. To this end, provision is made for a plurality of sensors and actuators, which capture and set the alignment of the optical element 13 in respect of all six degrees of freedom. The six degrees of freedom comprise translational movements along the three spatial axes and rotational movements about the three spatial axes. For reasons of simplicity, only one sensor arrangement 15, which captures the position of the optical element 13 in respect of one degree of freedom, is illustrated in the present case. The position captured by the sensor arrangement 15 is fed to a control unit (not illustrated in any more detail), which transmits a control signal to an actuator 50 which adjusts the position of the optical element 13 to the desired position relative to the frame 12. The actuator 50 can be used to set the position of the optical element 13 in respect of at least one degree of freedom.

The actuator 50 is connected to the frame 12 via a reaction mass 37 and a spring element 34. It is also possible to mount the optical element 13 and the actuator 50 via a reaction mass 37 and a spring element 34 with a subordinate frame (a so-called sub-frame), which is mounted on the system frame 12, optionally via further coupling or spring elements. For reasons of simplicity, a mount on the base plate 11 via only one frame 12 is illustrated in the illustrated example.

The reaction mass 37 has a natural frequency of typically 5-20 Hz. Together with the spring element 34, the reaction mass 37 forms a low-pass filter, which merely allows vibrations in this low frequency range to pass. When setting the optical element 13 via the actuator 50, reaction forces are generated, which counter the forces moving the optical element 13. Reaction forces with frequencies below the natural frequency of the reaction mass 37 are routed directly to the frame 12. By contrast, reaction forces with frequencies above the natural frequency of the reaction mass 37 are subject to low-pass filtering. Hence, a stabilization of the system is achieved by coupling the actuator 50 and the optical element 13 to the frame 12 via a reaction mass 37.

As the wavelength of the light used for illumination decreases, the demands in respect of the positional accuracy of the optical element 13 increase. Thus, positional inaccuracies in the nanometer range can already lead to illumination errors which render the manufactured semiconductor element useless in the case of EUV systems which operate with illumination light in the extreme ultraviolet range. Furthermore, the optical element 13 has a natural frequency which requires damping in this frequency range because otherwise small tremors and vibrations already lead to positional deviations, which have an adverse effect on the imaging accuracy. In order to obtain even better damping or stabilizing, provision is furthermore made for a damping device 30, which damps movements of the reaction mass 37 (and hence also movements of the actuator 50 and of the optical element 13, which are mounted on the reaction mass 37) relative to the frame 12. The damping device 30 is merely indicated schematically in FIG. 1.

According to one aspect of the invention, the damping device 30 is embodied as an eddy-current brake. Thus, the functional principle of an eddy-current brake is briefly explained in the following, before the design and the properties of the damping device 30, which is embodied as an eddy-current brake, are explained in detail.

Figure 2:
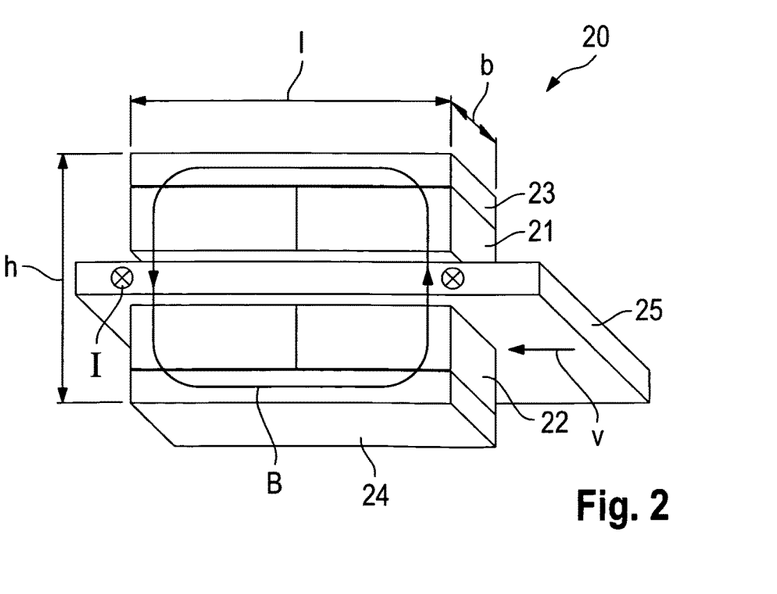
FIG. 2 schematically shows the functional principle of an eddy-current brake.

FIG. 2 schematically shows the functional principle of an eddy-current brake 20. This eddy-current brake 20 comprises a pair of magnets 21 and 22, the opposing poles of which are arranged opposite to one another. Thus, the north pole of magnet 21 is arranged opposite to the south pole of magnet 22, and vice versa. In order to guide the magnetic flux, a soft-iron plate 23 and 24 is respectively provided on the outer sides of the magnets 21 and 22. A gap in which a metal plate 25 is guided is provided between the magnets 21 and 22. If the metal plate 25 is now guided through the inhomogeneous magnetic field B with a velocity v, voltages and, as a result thereof, eddy currents I are then induced in the metal plate 25. These eddy currents I in turn generate their own magnetic fields which, according to Lenz's law, are counter to the external magnetic field. As a result, the metal plate 25 is braked, and the kinetic energy of the metal plate 25 is converted into heat.

From this simple model, it becomes apparent that a relative motion between the metal plate 25 and the magnets 21 and 22 is sufficient for the braking effect; i.e., it is also possible to keep the metal plate 25 stationary and move the magnets. Furthermore, it also becomes apparent that the braking effect only occurs if the metal plate 25 is moved through a magnetic-field gradient, i.e., in other words, if the movement direction of the metal plate 25 is moved transversely with respect to the direction of the magnetic field lines of the inhomogeneous magnetic field. Hence a damping effect can be obtained for two degrees of freedom, namely for the indicated movement in perpendicular direction in the plane of the paper and for a rotational movement about the perpendicular direction in the plane of the paper in FIG. 2.

The damping of this simple model can be determined as follows: the force which acts on the metal plate 25 is proportional to the magnetic field and to the length l of the magnets and is $$F = 2BlI \tag{1}$$

where B is the strength of the magnetic field. The current I emerges from the voltage U induced in the metal plate 25 and is dependent on the resistance R of the metal plate 25:

$$I = \frac{U}{R} = \frac{\frac{b}{2}h}{2l\rho} U \tag{2}$$

Here h is the width of the arrangement (cf. FIG. 2), b is the depth of the magnets and ρ is the resistivity of the metal plate 25. From $$U = 2Blv, \tag{3}$$

the damping d therefore emerges as $$d = \frac{F}{v} = \frac{B^2 blh}{\rho}. \tag{4}$$

In the following text, a damping device 30 of the lithography device 10 is described, which makes use of the above-described principle and obtains better damping over more degrees of freedom.

Figure 3:
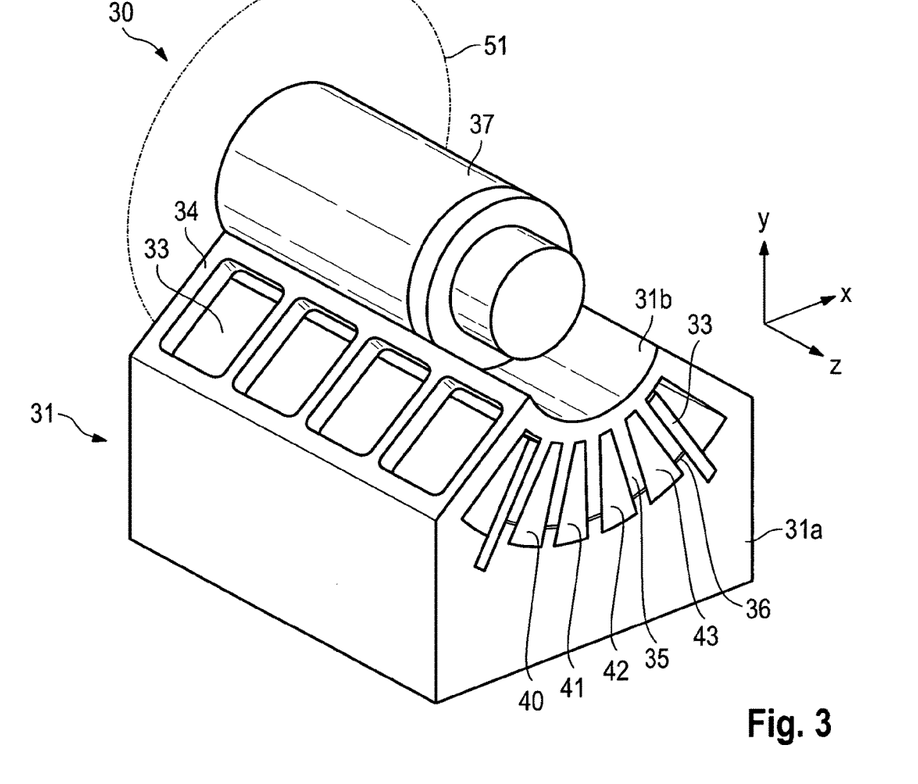
FIG. 3 shows a perspective view of a section of the lithography device from FIG. 1.
Figure 4:
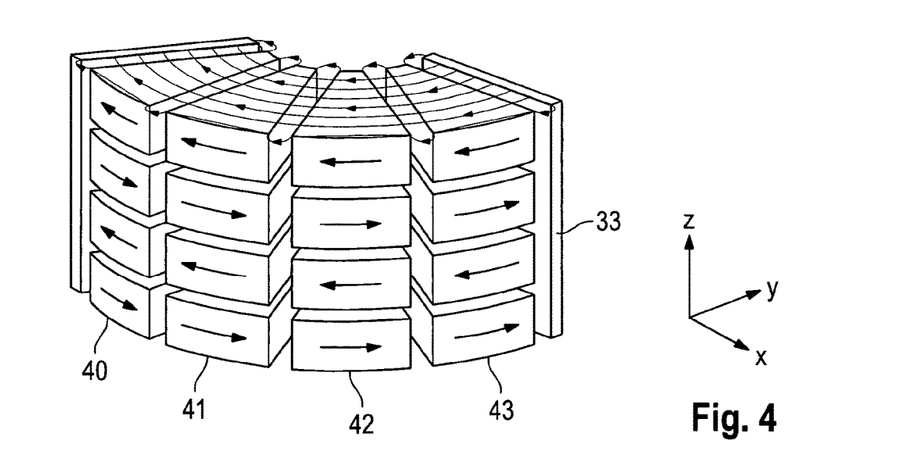
FIG. 4 shows the arrangement of the magnets of the damping device.
Figure 5:
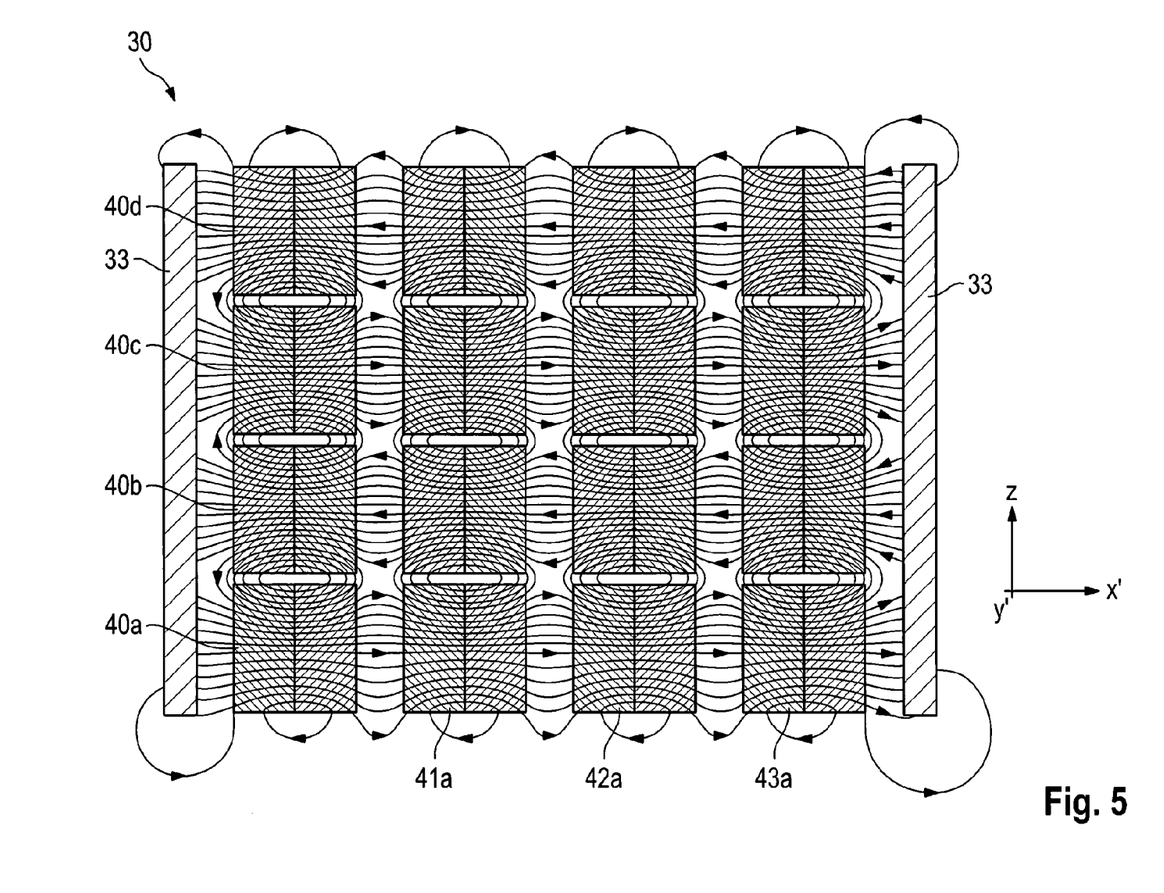
FIG. 5 shows a flat projection of the magnet arrangement.

FIG. 3 shows a perspective view of a section of the above-described lithography device 10, which substantially comprises the damping device 30, the reaction mass 37 and the spring element 34. FIG. 4 shows the arrangement of the magnets of this damping device 30. FIG. 5 shows a flat projection of the magnet arrangement. The z-axis in FIG. 5 is identical to the z-axis in FIGS. 3 and 4, whereas the other two Cartesian axes, namely the x'-axis and the y'-axis are not identical to the x-axis and the y-axis in FIGS. 3 and 4 as a result of the flat projection.

The damping device 30 is embodied as an eddy-current brake, which damps movements of the reaction mass 37 with respect to the frame 12. The damping device 30 has a holder device 31, four stacks of magnets 40-43 and two soft-iron plates 33. The holder device 31 can be attached to the frame 12, or else be provided on or in a housing of the actuator 50, and can be made of a metallic material. Suitable for this are metallic materials with a high conductivity, such as, for example, copper or copper alloys. Aluminium alloys, such as, for example, AW2014, offer a good compromise in respect of durability and conductivity and are therefore particularly suitable. The holder device 31 has a substantially cuboid base section 31a and a receptacle section 31b, which has the shape of a cylinder pipe which has been cut along its length. The base section 31a and the receptacle section 31b are interconnected by spring elements 34, which are embodied as webs. The base section 31a, the receptacle section 31b and the webs 34 therefore have an integral embodiment. The upper side of the base section 31a has a cut-out with a circular arc-shaped cross section. The four stacks of magnets 40-43 and the two soft-iron plates 33 are provided between the upper side of the base section 31a and the lower side of the receptacle section 31b. Furthermore, five fins 35 extend from the lower side of the receptacle section 31b toward the base section 31a in the radial direction. These fins 35 are electrically conductive sheets that are made of metal and are arranged between the stacks of magnets 40-43 and between the stacks of magnets 40, 43 and the soft-iron plates 33. Gaps 36 are provided between the lower edge of the fins 35 and the upper side of the base section 31a. Thus, a holder device 31 is provided, in which the base section 31a is flexibly connected to the receptacle section 31b via the webs 34. Here, the rigidity of the arrangement is relatively low in the z-direction. In other words, the webs 34 act as springs and the receptacle section 31b can be displaced in the z-direction by a relatively weak force acting against the spring force of the webs 34. By contrast, the rigidity of the arrangement in the x-direction and y-direction, and the rotational rigidity, is comparatively higher.

One end of the reaction mass 37 is held on the upper side of the receptacle section 31b and fixedly connected thereto. The other end of the reaction mass 37 is connected to the actuator 50. In the present example, the actuator 50 is embodied as voice-coil actuator. Here, the actuator 50 has a cylinder coil 51, the position of which is merely indicated schematically in FIG. 3 and which interacts with a magnetic armature provided at the end of the reaction mass 37. Hence the optical element 13, which is attached to the other end of the actuator 50, can be positioned in respect of one degree of freedom, namely the z-direction, by applying a suitable current to this cylinder coil 51.

In the illustrated example, the reaction mass 37 has a substantially cylindrical embodiment and can, for example, be made of steel or a tungsten alloy or the like. The reaction mass 37 acts as a low-pass filter as described above; this suppresses vibrations in a frequency range above the natural frequency of the reaction mass 37, which occur when the optical element is set. Here, the vibrations are mainly suppressed in respect of one degree of freedom, to be precise in the z-direction in the illustrated example.

As becomes apparent from FIG. 5 in particular, the stacks of magnets 40-43 each comprise four magnets 40a . . . 40d-43a . . . 43d, which, arranged one behind the other in the z-direction, are arranged in the holder device 31. When viewed in the section through the xy-plane, the magnets 40a . . . 40d-43a . . . 43d substantially have a trapezoidal shape or have the shape of a circular sector with a cut-off tip. The soft-iron plates 33 serve to complete or return the magnetic flux, and are arranged outside of and parallel to the outer stacks of magnets 40 and 43.

Here, magnets arranged one behind the other have an opposing orientation. Thus, the north pole of magnet 40a is arranged opposite to the south pole of the magnet 40b arranged therebehind and the south pole of magnet 40a is arranged opposite to the north pole of the magnet 40b arranged therebehind, cf. FIG. 5. By contrast, the stacks of magnets 40-43 have the same orientation, and so opposite poles of the magnets in the stacks of magnets 40-43 always lie opposite to one another. Thus, the result of this is a magnetic field line profile as illustrated in FIG. 5. As becomes apparent from this figure, provision is made for a strongly inhomogeneous magnetic field between the stacks of magnets 40-43, in which the direction of the magnetic field reverses a number of times along the z-axis. Thus, provision is made for a magnetic field with large gradients along the z-axis.

Together with the fins 35, the arrangement of the stacks of magnets 40-43 and soft-iron plates 33 acts as an eddy-current brake. Here, the function of the fins 35 corresponds to that of the metal plate 25 in FIG. 2. In the case of a displacement along the z-axis, the fins 35 move transversely with respect to the inhomogeneous magnetic field between the stacks of magnets 40-43, and so eddy currents are induced in the electrically conductive fins 35 and the kinetic energy of this movement is converted into heat. As a result of the alternating arrangement of the magnets 40a . . . 40d-43a . . . 43d in the stacks of magnets 40-43, the gradient of the magnetic field in the z-direction is particularly pronounced, and so a high degree of damping can be achieved. Experiments have shown modal damping for the primary degree of freedom (i.e. in the z-direction) of approximately 4.5%, and it is expected that modal damping of approximately 5% to 6% is possible in the case of further optimization.

Furthermore, the circular arrangement of the stacks of magnets 40-43 enables damping in a number of degrees of freedom. Thus, in the case of a flat or non-circular arrangement (this corresponds to the arrangement in FIG. 2, or an arrangement in accordance with the flat projection-style illustration in FIG. 5), the gradients of the magnetic field are small in the x-direction and y-direction. It follows that the eddy-current braking effect is not very pronounced in the x- and y-direction either in the case of such a flat arrangement. By contrast, what the circular arrangement of the magnets along a circular arc achieves is that the gradient of the magnetic field component in the x-direction and y-direction is increased substantially. Hence, damping of movements in the x-direction and in the y-direction is also achieved. Since all translational movements are damped, damping of all rotational movements is also achieved, and so, as a result, movements are damped in all six degrees of freedom. Furthermore, broad-band damping which is also effective down to low frequency ranges can be achieved.

The extent to which translational movements are damped in the x-direction and in the y-direction depends significantly on the circular-arc angle of the circular arc, along which the stacks of magnets 40-43 are arranged, and it naturally increases with the size of this circular arc. A noteworthy effect can already be achieved at relatively small circular-arc angles of, for example, 30°; a circular-arc angle of at least 45° is advantageous, a circular-arc angle of at least 90° is even more advantageous and a circular-arc angle of at least 180° is particularly advantageous. In an extreme case, the stacks of magnets 40-43 are arranged along a complete circle; this corresponds to a circular-arc angle of 360°. A corresponding embodiment is explained further below.

Compared to damping by rubber elements (e.g. made of Viton) or the like, a further advantage is that there is hardly any wear-and-tear on the damping device 30, since provision is not made for any parts that rub against one another and since the magnetic force of the magnets is stable, even over decades. Furthermore, there is no risk of abrasion of rubber particles either, which, for example, can become affixed to the optical element and impair the imaging properties. Furthermore, the magnets can be set precisely by way of their composition, and so the batch-dependence is also very low. In this case, rare-earth magnets such as, for example, neodymium magnets or magnets made of SmCo (samarium cobalt) alloys in particular have been found to be particularly advantageous. Furthermore, the rigidity is not influenced by the proposed arrangement, and no additional eigenmodes are generated, as is the case when damping using rubber elements.

The stacks of magnets 40-43 in this first embodiment each comprise four magnets; however, they can also comprise a different number of magnets. However, it is advantageous if the stacks of magnets 40-43 respectively comprise an even number of magnets because this prevents the formation of a parasitic magnetic field. In the case of an even number of magnets, the magnetic fluxes from the outer magnets 40a, 40c, 43a and 43c can be completely returned to the magnets 40b, 40d, 43b and 43d via the soft-iron plate, whereas this would not be possible in the case of an odd number of magnets and hence a parasitic magnetic field would be formed.

Second Embodiment

In the lithography device 10 as per the first embodiment, the magnets 40-43 are rigidly connected to the holder frame 12 via the holder device 31, while the fins 35 can move between the magnets with respect to the holder frame 12 and are rigidly connected to the reaction mass 37. However, a reverse arrangement is also possible, in which the magnets are rigidly connected to the reaction mass. Such an arrangement will be described in the following second embodiment.

Figure 6:
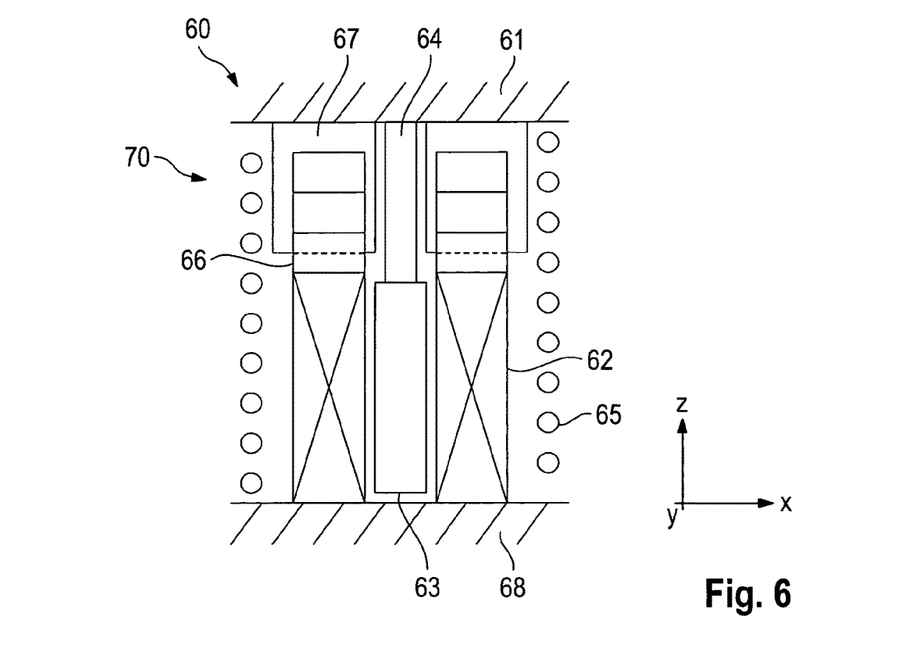
FIG. 6 schematically shows the design of an actuator with an integrated damping device in a lithography device as per a second embodiment.
Figure 7:
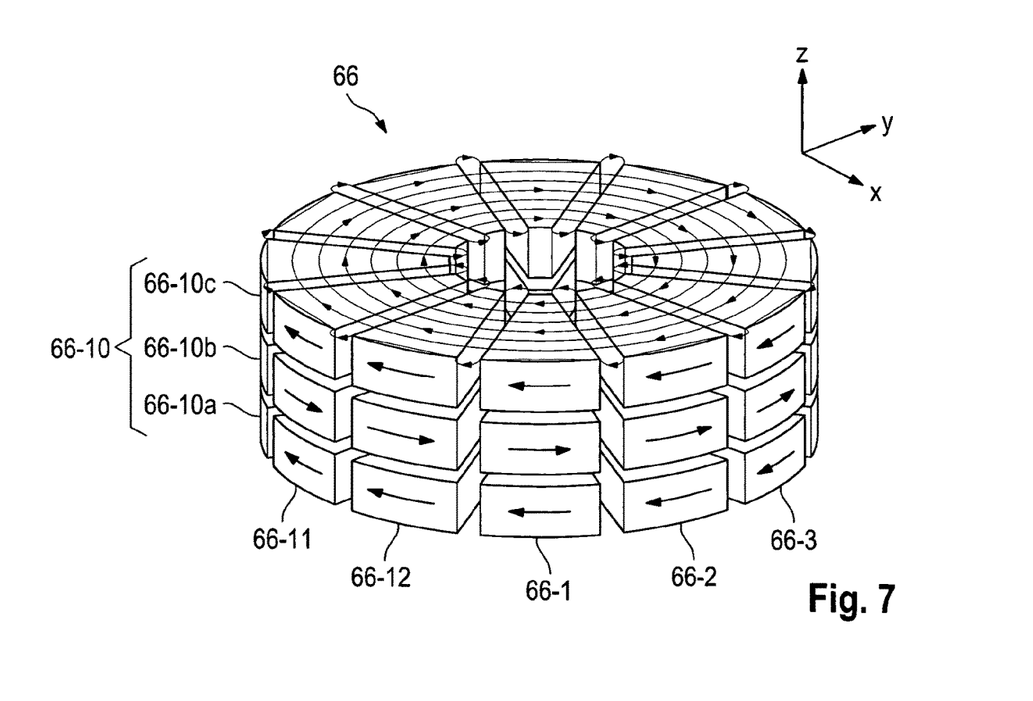
FIG. 7 shows the arrangement of the magnets of this damping device.
Figure 8:
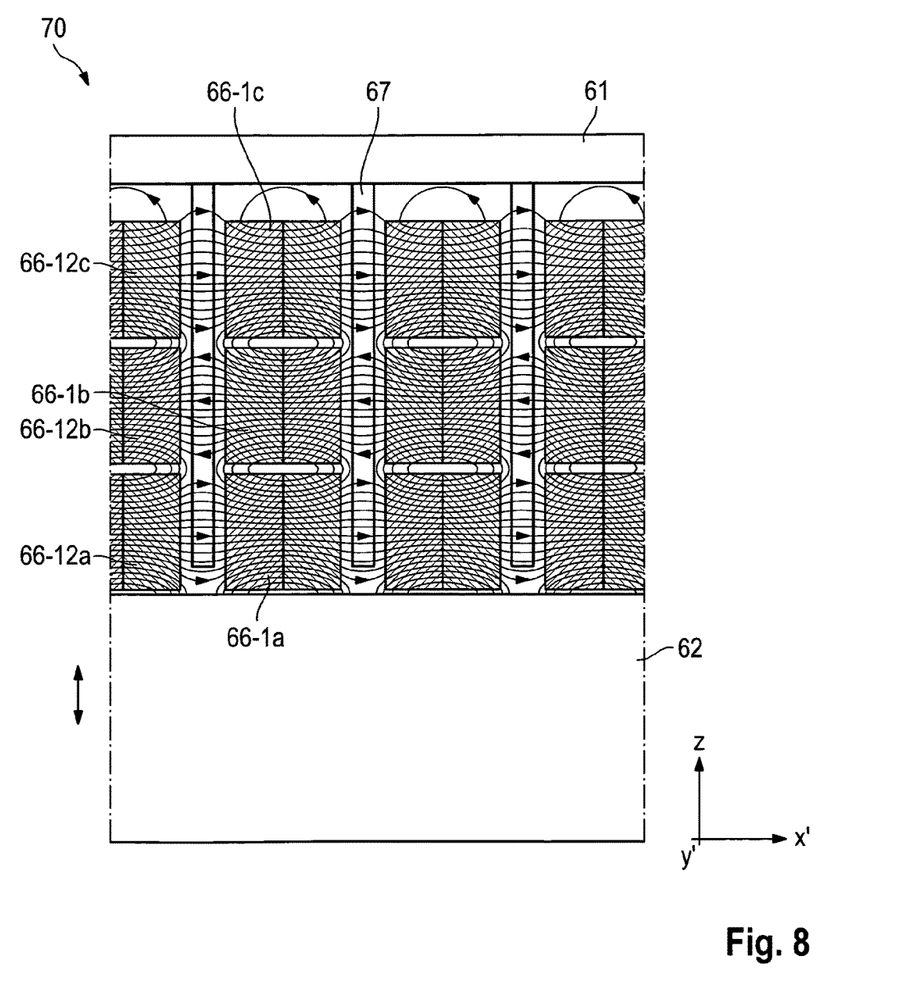
FIG. 8 shows a flat projection of the magnet arrangement.

A lithography device 10 as per the second embodiment has the same schematic design as illustrated in FIG. 1, and so a more detailed explanation of same is abstained from in the following text. FIG. 6 schematically shows the design of an actuator 60 with an integrated damping device 70, which is embodied as an eddy-current brake. FIG. 7 shows the arrangement of the magnets of this damping device 70. FIG. 8 shows a flat projection of the magnet arrangement. The z-axis in FIG. 8 is identical to the z-axis in FIGS. 6 and 7, whereas the other two Cartesian axes, namely the x'-axis and the y'-axis are not identical to the x-axis and the y-axis in FIGS. 6 and 7 as a result of the flat projection.

The actuator 60 is embodied as a magnetic gravity compensator, i.e. as a passive actuator for compensating for gravity, whereas the actuator in the first embodiment is embodied for active, i.e. arbitrary, fixation of the position of the optical element 13 in one spatial degree of freedom.

The actuator 60 comprises an actuator housing 61, a cylinder coil 62, a magnet piston 63, a pin 64 and a spring 65. The damping device 70 comprises a magnet arrangement 66 and fins 67. The actuator 60 couples an optical element 13 (structural element) to the holder frame 12.

To be more precise, the actuator housing 61 is rigidly connected to the optical element 13 (cf. FIG. 1) and the cylinder coil 62 is rigidly connected to a reaction mass 68, which is coupled to the frame 12 via a spring element 34 on the side thereof facing away from the actuator 60, cf. FIG. 1. As an alternative thereto, it is also possible for the cylinder coil 62 to be connected directly to the optical element 13 or for further coupling elements to be provided between the actuator 60, the holder frame 12 and the optical element 13. The magnet piston 63 is rigidly connected to the actuator housing 61 via the pin 64. If the cylinder coil 62 is excited by a control current, then a magnetic field is induced thereby, which interacts with the magnet piston 63 and therefore exerts a force in the z-direction on the optical element 13, as a result of which it is possible to set the position of the optical element 13 in the z-direction.

The spring 65 can be embodied as cylindrical spring, which surrounds the cylinder coil 62 and the magnet piston 63 arranged therein. The spring 65 is fixedly connected to the actuator housing 61 on the one side and fixedly connected to the reaction mass 68 on the other side. Hence the spring force of the spring 65 counteracts the force acting on the cylinder coil 62 in the z-direction, as a result of which the z-position can be stabilized and set more precisely.

The magnet arrangement 66 is provided on the end of the cylinder coil 62 facing away from the reaction mass 68, optionally via coupling elements (not illustrated in any more detail). The magnet arrangement 66 comprises twelve stacks of magnets 66-1 . . . 66-12, which are arranged along a circle, i.e. along a circular arc of 360°, cf. FIG. 7. The stacks of magnets 66-1 . . . 66-12 respectively have three magnets (denoted by a, b and c in FIG. 7), which are arranged one behind the other or one over the other in the z-direction. Hence, the magnets are arranged in three planes or steps. When viewed in the section through the xy-plane, the magnets of the stacks of magnets 66-1 . . . 66-12 substantially have a trapezoidal shape or have the shape of a circular sector with a cut-off tip. Thus, overall, this results in a cylindrical shape for the magnet arrangement 66, wherein a likewise cylindrical cut-out, through which the pin 64 is guided, is provided in the centre of the magnet arrangement 66, cf. FIG. 6. Since the stacks of magnets 66-1 . . . 66-12 are arranged in a completely encircling manner, there is no need to provide soft-iron plates for completing the magnetic flux in this embodiment. Hence it is also possible, like in the illustrated example, to provide an odd number of magnets in the individual stacks of magnets 66-1 . . . 66-12. This is possible because the magnetic flux extends in a circular fashion through all stacks of magnets 66-1 . . . 66-12 and no or almost no parasitic magnetic field is generated, even in the case of an odd number of magnets.

Here, magnets arranged one behind the other have an opposing orientation. In other words, the north pole of magnet 66-1a is arranged opposite to the south pole of the magnet 66-1b arranged therebehind, and the south pole of magnet 66-1a is arranged opposite to the north pole of the magnet 66-1b arranged therebehind. By contrast, the stacks of magnets 66-1 to 66-12 have the same orientation, and so opposite poles of the magnets in the stacks of magnets 66-1 . . . 66-12 always lie opposite to one another. Thus, the result of this is a magnetic field line profile as illustrated in FIG. 8. As becomes apparent from this figure, provision is made for a strongly inhomogeneous magnetic field between the stacks of magnets 66-1 . . . 66-12, in which the direction of the magnetic field reverses a number of times along the z-axis. Thus, provision is made for a magnetic field with large gradients along the z-axis.

The fins 67 are respectively arranged between two adjacent stacks of magnets 66-1 . . . 66-12. Metallic materials with a high conductivity, such as, for example, copper or copper alloys, are also suitable for the fins 67. Aluminium alloys, such as, for example, AW2014, offer a good compromise in respect of durability and conductivity and are therefore particularly suitable. Like in the first embodiment, the stacks of magnets 66-1 . . . 66-12 together with the fins 67 form an eddy-current brake 70 as damping device. If the magnet arrangement 66 is displaced along the z-axis, eddy currents are induced in the fins 67 and the kinetic energy of this movement is converted into heat. As a result of the alternating arrangement of the magnets in the stacks of magnets 66-1 . . . 66-12, the gradient of the magnetic field in the z-direction is particularly pronounced, and so a high degree of damping can be achieved. Experiments have shown modal damping for the primary degree of freedom (i.e. in the z-direction) of approximately 2.5%, and it is expected that modal damping of up to 5% is possible in the case of further optimization.

Similar advantageous effects, as in the arrangement as per the first embodiment, also emerge from this arrangement. Thus, the circular arrangement of the stacks of magnets 66-1 . . . 66-12 enables damping in a number of degrees of freedom. To be more precise, broad-band damping in all six degrees of freedom is also achieved in this arrangement. Furthermore, the damping is frictionless, and so it is low maintenance and ensures a long service life of the damping arrangement. A further advantage of this arrangement is that it is very compact. Furthermore, the rigidity is not influenced by the proposed arrangement, and no additional eigenmodes are generated, as is the case when damping using rubber elements.

Furthermore, the magnet arrangement 66 is in this embodiment fixedly connected to the reaction mass 68 via the coil 62. The magnet arrangement 66 therefore contributes to the reaction mass or can be considered to be part of the reaction mass. As a result, it is possible to use more rigid spring elements 65, simplifying the design of the actuators.

Third Embodiment

In the magnet arrangement of the second embodiment, the magnets are arranged in stacks 66-1 to 66-12. The magnets of different stacks 66-1 to 66-12 that are arranged in the same x-y plane respectively constitute a set of magnets arranged in an arc-shaped arrangement whose arc extends over 360° in the x-y plane. In the arrangement shown in FIG. 7, there are three of such sets of magnets, stacked upon each other in the z-direction. Each of those sets of magnets is roughly disk-shaped. Now, since these sets of magnets are stacked upon each other in the z-direction, the primary direction to be damped is also the z-direction. However, it is not necessary to stack these magnets linearly, and they can also be stacked upon each other in arc-shapes. This is explained in the following with reference to FIGS. 9 and 10.

Figure 9:
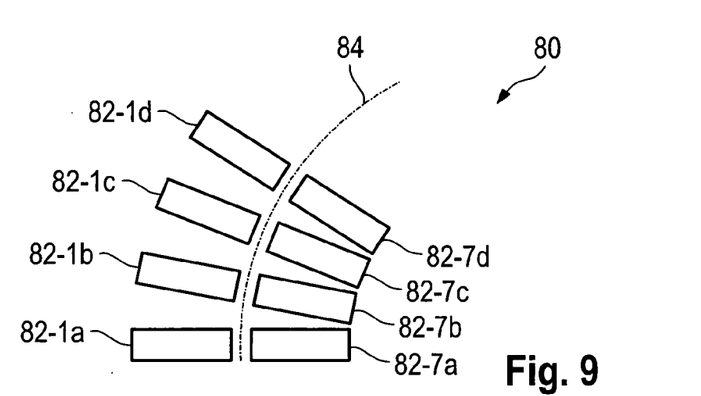
FIG. 9 shows a magnet arrangement of an eddy current damper in accordance with a first variant of the third embodiment.

FIG. 9 shows a magnet arrangement 80 of an eddy current damper in accordance with a first variant of the third embodiment. It should be noted that for illustrative reasons, FIG. 9 shows only the magnets of the eddy current damper and other elements have been omitted. As in the arrangement of FIG. 7, the magnet arrangement 80 in FIG. 9 is also composed of roughly disk-shaped sets of magnets that are stacked one upon the other. Also, like in FIG. 7, also in the arrangement of FIG. 9, each set of magnets includes 12 trapezoid magnets 82-1 to 82-12 (only the magnets 82-1 and 82-7 are shown in FIG. 9). Whereas there are three of such sets of magnets in the embodiment shown in FIG. 7 (i.e. each stack includes three magnets), there are four of such sets of magnets in the embodiment shown in FIG. 9 (i.e. each stack includes four magnets, denoted as e.g. 82-1a to 82-1d).

Moreover, whereas in the arrangement shown in FIG. 7, each of the sets of magnets is arranged in parallel planes, namely the x-y plane and planes parallel thereto, in the arrangement shown in FIG. 9, the planes in which the various sets of magnets are arranged are tilted with respect to each other. More specifically, the first set of magnets 82-1a to 82-12a is arranged in the x-y plane. The second set of magnets 82-1b to 82 is arranged in a plane that is tiled at an angle of e.g. 10° with respect to the the x-y plane, and so on. Further aspects of the magnet arrangement of this embodiment are as explained with respect to the second embodiment, so that further explanations have been omitted.

The result of this magnet arrangement 80 is that the various sets of magnets are arranged along an arc-shaped trajectory 84 of the structural element whose movement is to be damped. More specifically, the structural element whose movement is to be damped moves along the arc-shaped trajectory 84 indicated by the dash-dotted line in FIG. 9. Thus, it is possible to dampen the movement not only of structural elements that perform a linear or a rotational movement, but also the movement of structural elements that move along an arc-shaped trajectory 84. Needless to say, the curvature and the direction of the arc-shaped trajectory 84 does not need to be constant along the trajectory, but can be adapted as needed. For example, the arc-shaped trajectory 84 does not need to be arranged within a single plane (as in FIG. 9), but can be as complex as needed.

Moreover, with this magnet arrangement 80, the movement of the structural element can be damped with a compact arrangement. Here, the various sets of magnets are each arranged within a plane that extends perpendicularly with respect to the tangent of the arc-shaped trajectory 84, however there is no limitation to this and they can also be arranged at an angle of e.g. up to 45° with respect to the arc-shaped trajectory 84. However, a greater damping ratio can be attained when the sets of magnets are respectively arranged in planes that are substantially perpendicular to the arc-shaped trajectory 84.

Figure 10:
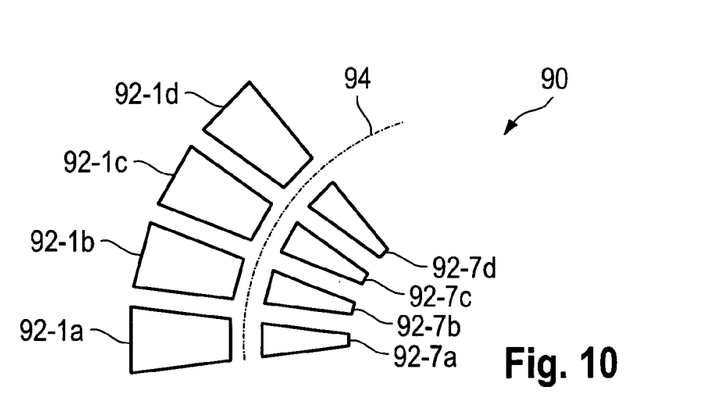
FIG. 10 shows a magnet arrangement of an eddy current damper in accordance with a second variant of the third embodiment.

FIG. 10 shows a magnet arrangement 90 of an eddy current damper in accordance with a second variant of the third embodiment. Also in this magnet arrangement 90, stacks of magnets 92-1 to 92-12 (only 92-1 and 92-7 are shown in FIG. 10) are arranged along an arc-shaped trajectory 94 of a structural element whose movement is to be damped. The magnet arrangement 90 differs from the magnet arrangement 80 in FIG. 9 in that the magnets in the arrangement 90 have a trapezoidal cross-section when cut in the y-z plane. Accordingly, a high damping ratio can be attained with a compact arrangement of magnets. By contrast, the magnets in the magnet arrangement 80 in FIG. 9 have a rectangular cross-section, so that the gaps between the sets of magnets vary depending on the radial distance from the arc-shaped trajectory 84.

It should be noted that the embodiments described above are merely exemplary and can be varied in many different ways within the scope of protection of the patent claims.

Thus, the preceding embodiments described lithography devices with an eddy-current brake for damping the movement of a reaction mass or of an optical element. However, it is likewise possible to use the eddy-current brake for damping the movement of other moveable structural elements of the lithography device.

Furthermore, in the preceding embodiments, the magnets are arranged in a circular arc-shaped arrangement, which allows a particularly compact arrangement. However, there is no limitation to circular arc shapes and other arc shapes, such as elliptical, hyperbolic, parabolic arc shapes and the like are possible as well.

Furthermore, in the preceding embodiments, the fins (i.e. the electrically conductive sheets) are coupled mechanically to the actuator or to the structural elements. But they may also be coupled electromagnetically, magnetically or electrostatically. In particular, the support of the fins is not limited to the arrangement shown in FIG. 3, and they can also be supported by a further magnetic support or gas support.

Furthermore, in the preceding embodiments, the magnets are arranged in stacks, i.e. several sets of magnets are layered upon one another. However, it is also possible that a single set of magnets is provided, e.g. corresponding only to the bottom-most layer of magnets 66-1*a* to 66-12*a* in the arrangement shown in FIG. 7.

LIST OF REFERENCE SYMBOLS

10 Lithography device
11 Main plate
12 Holder frame
13 Optical element
14 Measurement frame
15 Sensor arrangement
16 Wafer receptacle
17 Wafer
18 Illumination device
19 Mask
20 Eddy-current brake
21, 22 Magnets
23, 24 Soft-iron sheets
25 Metal plate
30 Eddy-current brake arrangement
31 Holder device
31*a* Base section
31*b* Receptacle section
32 Stack of magnets
33 Soft-iron plates
34 Webs
35 Fins
36 Gaps
37 Reaction mass
40-43 Magnets
50 Actuator
51 Cylinder coil
60 Actuator
61 Actuator housing
62 Cylinder coil
63 Magnet piston
64 Pin
65 Spring
66 Magnetic arrangement
66-1 . . . 66-12 Magnet stacks
67 Fins
68 Reaction mass
70 Eddy-current brake arrangement
80 Magnet arrangement
82-1 . . . 82-12 Magnet stacks
84 trajectory
90 Magnet arrangement
92-1 . . . 92-12 Magnet stacks
94 trajectory

What is claimed is:

1. A device, comprising:
   a structural element; and
   an eddy-current brake, comprising:
      a plurality of magnets disposed in an arc-shaped arrangement; and
      a plurality of electrically conductive sheets arranged so that an electrically conductive sheet is between adjacent magnets,
   wherein:
      the structural element and the eddy-current brake are configured so that a relative movement between the magnets and the electrically conductive sheets in a direction induces eddy currents in the electrically conductive sheets to dampen movement of the structural element in the direction;
      the device further comprises a holder configured to hold the magnets;
      the holder comprises a base section interconnected to a receptacle section by spring elements;
      the receptacle section is connected to the structural element; and
      the device is a lithography device.

2. The device of claim 1, wherein, for at least one magnet of the plurality of magnets, the at least one magnet comprises a stack of magnets.

3. The device of claim 2, wherein adjacent magnets in the stack of magnets are arranged so that opposing poles of the magnets are next to one another.

4. The device of claim 2, wherein the stack of magnets comprises an even number of magnets.

5. The device of claim 2, wherein the magnets of the stack of magnets are separated from each other along a direction of an arc defined by the arc-shaped arrangement.

6. The device of claim 2, wherein the magnets of the stack of magnets are separated from each other along a direction perpendicular to a direction of an arc defined by the arc-shaped arrangement.

7. The device of claim 1, wherein, for at least two magnets of the plurality of magnets, each of the at least two magnets comprises a stack of magnets.

8. The device of claim 1, wherein an arc defined by the arc-shaped arrangement extends over an angle of 360°.

9. The device of claim 1, wherein the plurality of magnets is disposed in a circular arc-shaped arrangement.

10. The device of claim 1, wherein the magnets are trapezoidal.

11. The device of claim 1, wherein:
   the plurality of magnets is configured to generate a magnetic field that extends in a plane that includes an arc defined by the arc-shaped arrangement; and
   the direction extends at an angle that is not greater than 45° with respect to a normal to the plane.

12. The device of claim 11, wherein the direction extends substantially parallel to a normal to the plane.

13. The device of claim 1, wherein:
the eddy-current brake comprises a plurality of sets of magnets;
the magnets of each set are disposed in an arc-shaped arrangement within a predetermined plane; and
planes of adjacent sets of magnets are tilted with respect to each other so that the sets are disposed along a trajectory of the structural element.

14. The device of claim 13, wherein the trajectory of the structural element is arc-shaped.

15. The device of claim 1, wherein the electrically conductive sheets are attached to the structural element.

16. The device of claim 1, wherein the electrically conductive sheets are coupled to a moving part of an actuator configured to position the structural element.

17. The device of claim 1, wherein the magnets are attached to the structural element.

18. The device of claim 1, wherein the structural element is arranged in a moveable fashion relative to the magnets.

19. The device of claim 1, wherein the magnets are arranged in a cylindrical magnet arrangement attached to a cylinder coil of an actuator configured to position the structural element.

20. The device of claim 1, wherein the structural element comprises an optical element.

21. The device of claim 1, wherein the structural element comprises a reaction mass.

22. The device of claim 1, wherein, for at least one of the electrically conductive sheets, the electrically conductive sheet is between its adjacent magnets along a direction of an arc defined by the arc-shaped arrangement.

23. The device of claim 1, wherein the spring elements comprise webs.

24. The device of claim 23, wherein the webs extend radially between the receptacle section and the base section.

25. The device of claim 1, wherein an arc defined by the arc-shaped arrangement extends over an angle of at least 30°.

26. A device, comprising:
a structural element; and
an eddy-current brake, comprising:
a plurality of magnets disposed in an arc-shaped arrangement; and
a plurality of electrically conductive sheets arranged so that an electrically conductive sheet is between adjacent magnets,
wherein:
the structural element and the eddy-current brake are configured so that a relative movement between the magnets and the electrically conductive sheets in a direction induces eddy currents in the electrically conductive sheets to dampen movement of the structural element in the direction;
the plurality of magnets is configured to generate a magnetic field that extends in a plane that includes an arc defined by the arc-shaped arrangement; and
the direction extends at an angle that is not greater than 45° with respect to a normal to the plane; and
the device is a lithography device.

27. The device of claim 26, wherein the direction extends substantially parallel to a normal to the plane.

* * * * *

UNITED STATES PATENT AND TRADEMARK OFFICE
CERTIFICATE OF CORRECTION

| | | |
|---|---|---|
| PATENT NO. | : 9,887,613 B2 | Page 1 of 1 |
| APPLICATION NO. | : 14/456541 | |
| DATED | : February 6, 2018 | |
| INVENTOR(S) | : Alexander Vogler and Markus Hauf | |

It is certified that error appears in the above-identified patent and that said Letters Patent is hereby corrected as shown below:

In the Specification

Column 12, Line 26: Delete "the the" and insert -- the --, therefor.

Signed and Sealed this
Third Day of April, 2018

Andrei Iancu
*Director of the United States Patent and Trademark Office*